United States Patent
Na

(10) Patent No.: US 10,028,379 B2
(45) Date of Patent: Jul. 17, 2018

(54) PRINTED CIRCUIT BOARD AND LIGHTING UNIT INCLUDING THE SAME

(71) Applicant: LG INNOTEK CO., LTD., Seoul (KR)

(72) Inventor: Se Woong Na, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 290 days.

(21) Appl. No.: 14/894,831

(22) PCT Filed: Apr. 22, 2014

(86) PCT No.: PCT/KR2014/003486
§ 371 (c)(1),
(2) Date: Nov. 30, 2015

(87) PCT Pub. No.: WO2014/193084
PCT Pub. Date: Dec. 4, 2014

(65) Prior Publication Data
US 2016/0120030 A1  Apr. 28, 2016

(30) Foreign Application Priority Data

May 31, 2013 (KR) .................. 10-2013-0063108

(51) Int. Cl.
*H05K 1/05* (2006.01)
*F21V 8/00* (2006.01)
(Continued)

(52) U.S. Cl.
CPC .......... *H05K 1/056* (2013.01); *G02B 6/0001* (2013.01); *G02B 6/0011* (2013.01);
(Continued)

(58) Field of Classification Search
CPC ...... H05K 1/056; H05K 1/111; H05K 1/0203; H05K 1/181; H05K 3/303; H05K 3/0061;
(Continued)

(56) References Cited

U.S. PATENT DOCUMENTS

2006/0119761 A1* 6/2006 Okuda ................ G02F 1/13452
349/58
2009/0159905 A1* 6/2009 Chen ........................ F21K 9/00
257/88

(Continued)

FOREIGN PATENT DOCUMENTS

KR 10-2012-0014392 A 2/2012
KR 10-2013-0030619 A 3/2013

(Continued)

OTHER PUBLICATIONS

International Written Opinion and Search Report dated Aug. 25, 2014 issued in Application No. PCT/KR2014/003486 (with English translation of Search Report).

(Continued)

*Primary Examiner* — David V Bruce
(74) *Attorney, Agent, or Firm* — KED & Associates, LLP

(57) ABSTRACT

Provided are a printed circuit board a lighting unit including the printed circuit board, the printed circuit board including: a metal substrate; a light emitting element disposed on the metal substrate; and a wiring portion disposed between the light emitting element and the metal substrate.

19 Claims, 4 Drawing Sheets

(51) Int. Cl.
  *H05K 1/02* (2006.01)
  *H05K 1/18* (2006.01)
  *H05K 3/00* (2006.01)
  *H05K 1/11* (2006.01)
  *H05K 3/30* (2006.01)

(52) U.S. Cl.
  CPC ........... *H05K 1/0203* (2013.01); *H05K 1/111* (2013.01); *H05K 1/181* (2013.01); *H05K 3/0061* (2013.01); *H05K 3/303* (2013.01); H05K 2201/10106 (2013.01); *Y02P 70/611* (2015.11)

(58) Field of Classification Search
  CPC ........ H05K 2201/10106; G02B 6/0011; G02B 6/0001; Y02P 70/611
  See application file for complete search history.

(56) References Cited

U.S. PATENT DOCUMENTS

| | | |
|---|---|---|
| 2009/0190061 A1 | 7/2009 | Lee et al. |
| 2012/0155115 A1 | 6/2012 | Jang |

FOREIGN PATENT DOCUMENTS

| | | |
|---|---|---|
| KR | 2013-0030618 | 3/2013 |
| KR | 10-2013-0053873 A | 5/2013 |

OTHER PUBLICATIONS

Chinese Office Action dated Jun. 28, 2017 issued in Application No. 201480043655.5 (with English Translation).

* cited by examiner

【Figure 1】
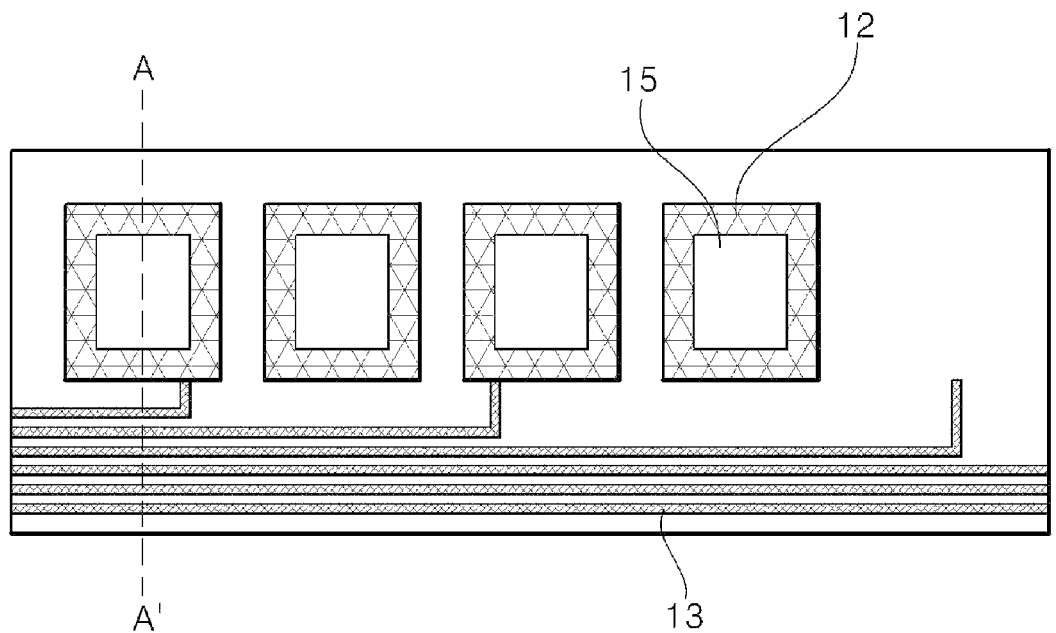
【Figure 2】
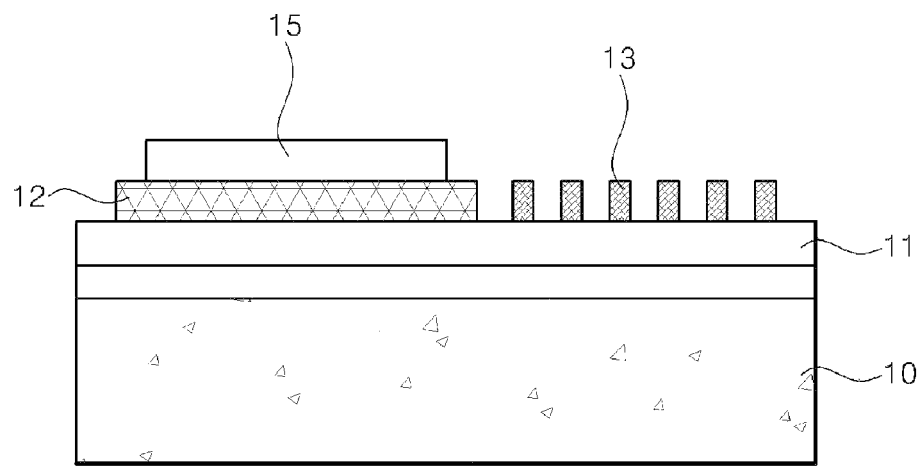

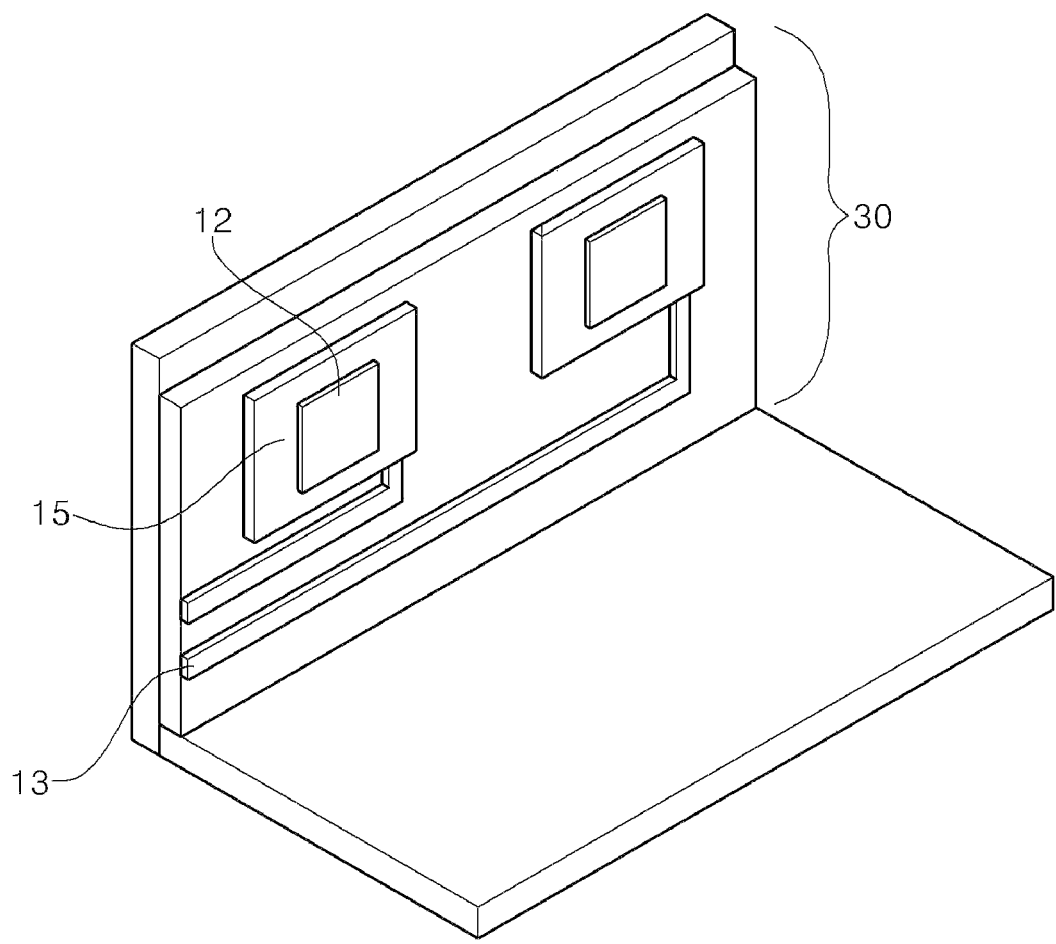

【Figure 4】
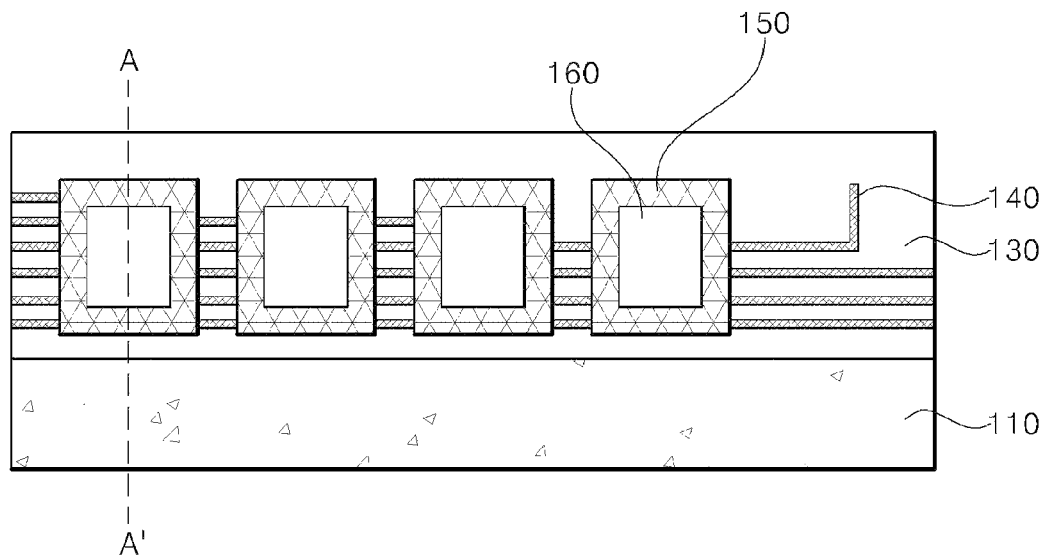
【Figure 5】
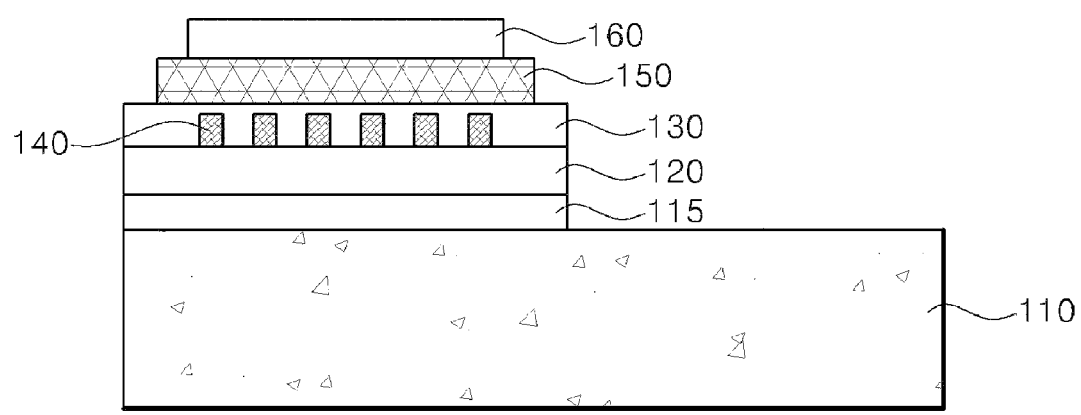

【Figure 6】
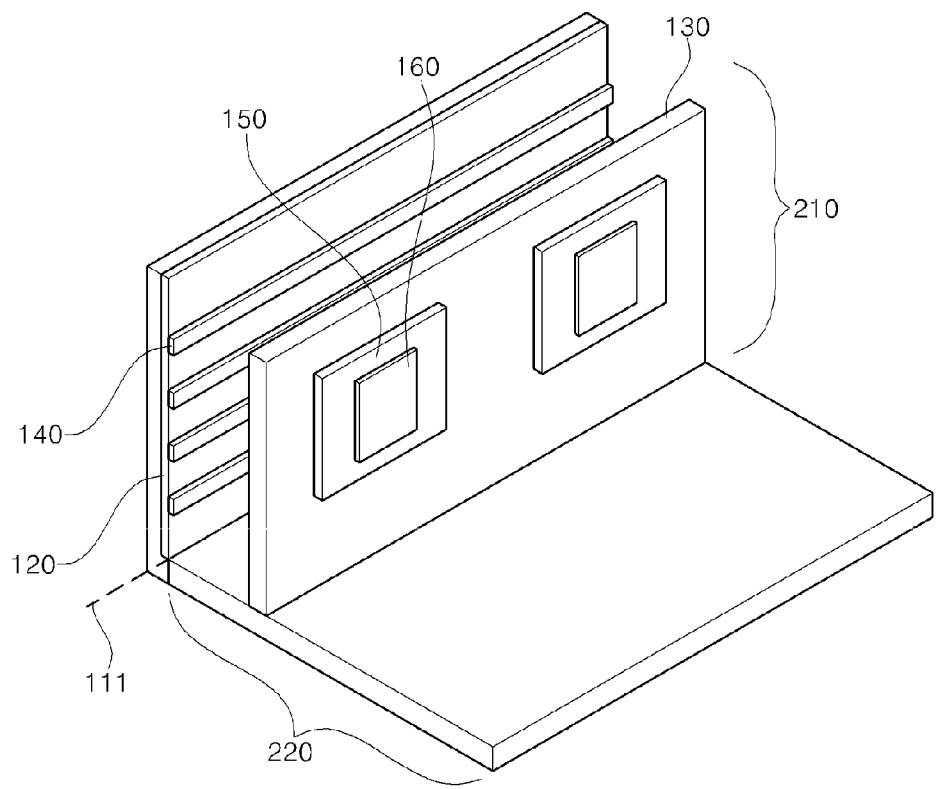
【Figure 7】
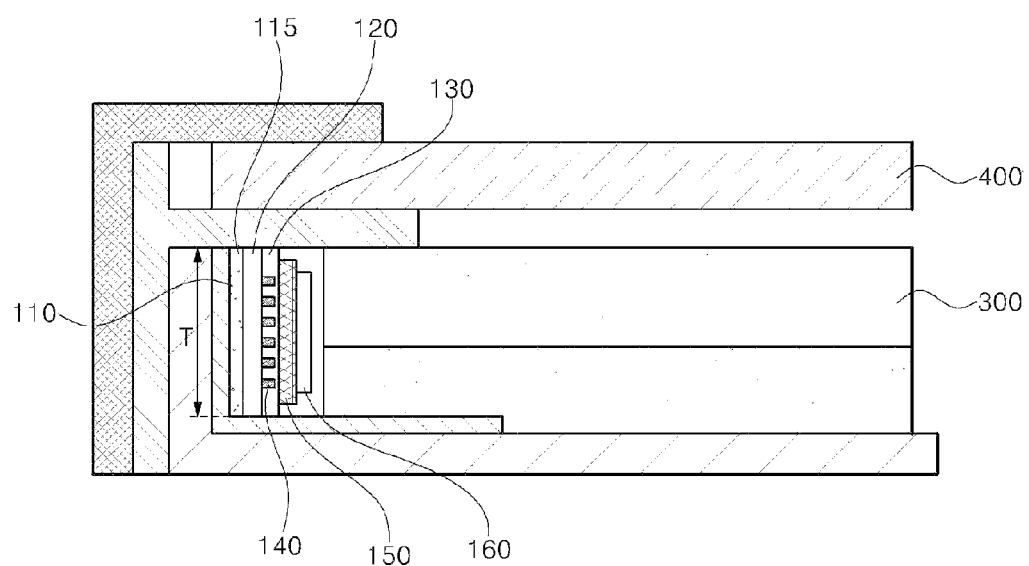

PRINTED CIRCUIT BOARD AND LIGHTING UNIT INCLUDING THE SAME

CROSS-REFERENCE TO RELATED PATENT APPLICATIONS

This application is a U.S. National Stage Application under 35 U.S.C. 5371 of PCT Application No. PCT/KR2014/003486, filed Apr. 22, 2014, which claims priority to Korean Patent Application No. 10-2013-0063108, filed May 31, 2013, whose entire disclosures are hereby incorporated by reference.

BACKGROUND OF THE INVENTION

Field of the Invention

Embodiments of the present invention relate to a printed circuit board and a lighting unit including the printed circuit board that can be easily manufactured and designed.

Description of the Related Arts

According to the development of electronics industries, various display devices have been developed, and imaging devices, computers, mobile communication terminals and the like using the display devices have been also developed. A liquid crystal display appearing by reflecting this trend has been widely used as a display for a monitor, a mobile communication terminal and the like.

A liquid crystal display (LCD) results from applying electro-optical properties of liquid crystal having an in-between characteristic of a liquid and a solid to a display device, and is an electrical device that changes various kinds of electrical information generated from various devices to visual information and transmit the changed visual information using a variation in transmittance of liquid crystal resulting from an applied voltage. It is advantageous in that the LCD has low power consumption due to a low operating voltage and is also portable Since the LCD has no self-luminous which can make its own light, a backlight is needed. A backlight serves a light source of LCDs and refers to a complex composed of a light source itself for irradiating light to a rear surface of a liquid module, a power circuit for driving the light source, and all components for enabling uniform flat light to be formed.

A backlight unit using a light emitting diode (LED) has been suggested as a light source for illumination of the LCD. An LED is a light emitting element generating light using a photoemission phenomenon generated when a voltage is applied to a semiconductor. The LED is small in its size and has a long lifespan compared to existing light sources. In addition, it is advantageous in that the LED has high energy efficiency and a low operating voltage because it directly converts electrical energy into light energy.

The liquid crystal display device becomes gradually thin, and accordingly, a reduction in a width of the liquid crystal display device has been needed.

FIGS. 1 to 3 are views illustrating a printed circuit board of a backlight unit according to a conventional art wherein FIG. 2 is a cross sectional view taken along lines A-A' of the printed circuit board of FIG. 1, and FIG. 3 is a perspective view of the printed circuit board according to the conventional art.

As illustrated in FIG. 1, a printed circuit board (PCB) is configured such that a mounting pad 12 is formed, a light emitting element 15 is mounted to the mounting pad 12, and a string wiring 13 electrically connected to the mounting pad 12 and transmitting an electrical signal to the light emitting element 15 is formed.

Referring to FIG. 2, it can be seen that the printed circuit board according to the conventional art is configured such that both the mounting pad 12 to which the light emitting element 15 is mount, and the string wiring 13 are disposed on an insulating layer formed on a substrate 10.

However, according to the conventional art, as illustrated in FIG. 3, when the printed circuit board is subjected to bending treatment, since the mounting pad 12, the light emitting element 15, and the string wiring 13 are disposed in a mounting area 30, it is problematic in that it is difficult to realize slimming of a product to which the printed circuit board is applied due to a width of the mounting area 30.

SUMMARY OF THE INVENTION

Accordingly, embodiments of the present invention have been devised for solving the above problems. An object of embodiments of the present invention provide to provide a printed circuit board and a lighting unit to which the printed circuit board is applied, slimming of the lighting unit being realized by minimizing a width of an area of the printed circuit board in which a light emitting element and a wiring portion are formed.

In order to solve the problems, according to an aspect of embodiments of the present invention, a printed circuit board includes: a metal substrate; a light emitting element disposed on the metal substrate; and a wiring portion disposed between the light emitting element and the metal substrate.

According to some embodiments of the present invention, the printed circuit board may further include a first insulating layer disposed between the metal substrate and the wiring portion.

According to some embodiments of the present invention, the printed circuit board may further include a second insulating layer laminated between the first insulating layer and the light emitting element, wherein the wiring portion may be formed in the second insulating layer.

According to some embodiments of the present invention, the printed circuit board may further include: a bonding sheet adopted to bond the first insulating layer to the metal substrate; and a metal pad formed between the wiring portion and the light emitting element and adopted to electrically connect the wiring portion and the light emitting element.

According to some embodiments of the present invention, the printed circuit board may include: a first region in which the wiring portion and the light emitting element are disposed; and a second region extending from the first region.

According to some embodiments of the present invention, the printed circuit board may further include a bent portion formed between the first region and the second region.

According to some embodiments of the present invention, the first insulating layer may be formed in a film or tape form.

According to some embodiments of the present invention, the first insulating layer may contain at least one of a polyimide resin, a polyester resin, an epoxy resin, and a phenol resin.

According to another aspect of embodiments of the present invention, a lighting unit includes: a printed circuit board including a metal substrate, a light emitting element disposed on the metal substrate, and a wiring portion disposed between the light emitting element and the metal substrate; and a light guide plate adopted to diffuse light from the light emitting element.

According to some embodiments of the present invention, since a width of the area of the printed circuit board in which the lighting emitting element and the wiring portion are formed can be minimized, slimming of the lighting unit to which the printed circuit board is applied can be realized.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1 to 3 are views illustrating a printed circuit board of a backlight unit according to a conventional art;

FIG. 4 is a top view illustrating a printed circuit board according to an embodiment of the present invention;

FIG. 5 is a cross-sectional view illustrating the printed circuit board according to the embodiment of the present invention;

FIG. 6 is a view illustrating a printed circuit board according to another embodiment of the present invention; and FIG. 7 is a view illustrating a lighting unit including the printed circuit board according to the embodiment of the present invention.

DETAILED DESCRIPTION OF THE INVENTION

Hereinafter, embodiments of the present invention will be described in detail with reference to the accompanying drawings. The present invention may, however, be embodied in different forms and should not be construed as limited to the embodiments set forth herein. In the following description, it is to be noted that, when the functions of conventional elements and the detailed description of elements related with the present invention may make the gist of the present invention unclear, a detailed description of those elements will be omitted. In addition, it should be understood that the shape and size of the elements shown in the drawings may be exaggeratedly drawn to provide an easily understood description of the structure of the present invention. As used herein, the singular forms "a," "an" and "the" are intended to include the plural forms as well, unless the context clearly indicates otherwise.

FIG. 4 is a top view illustrating a printed circuit board according to an embodiment of the present invention, and FIG. 5 is a cross sectional view of the printed circuit board according to the embodiment of the present invention. More specifically, FIG. 5 is a cross-sectional view showing a section taken along lines A-A' of the printed circuit board according to the embodiment of the present invention, illustrated in FIG. 4.

As illustrated in FIGS. 4 and 5, the printed circuit board according to the embodiment of the present invention includes: a metal substrate 110; a first insulating layer 120; a second insulating layer 130; a metal pad 150; and a light emitting element 160.

As illustrated in FIG. 4, the insulating layer 120 is formed on the metal substrate 110, wherein the first insulating layer 120 may adhere to the metal substrate 110 via a bonding sheet 115.

The first insulating layer 120 may be formed in a film form or a tape form and may contain at least one of a polyimide resin, a polyester resin, an epoxy resin and a phenol resin.

Meanwhile, the metal substrate 110 on which the first insulating layer 120 is formed may be made of a material including at least one of Al, Au, Ag, and Cr.

A wiring portion 140 is disposed at a position correspond to an upper part of the first insulating layer 120, wherein the wiring portion 140 may be made of Cu.

In detail, the second insulating layer 130 is laminated on the first insulating layer 120, and the wiring portion 140 is disposed in the second insulating layer 130. To do so, after the wiring portion 140 has been formed on the first insulating layer 120, the second insulating layer 130 may be formed again on the first insulating layer 120 to cover the wiring portion 140.

The metal pad 150 is formed on the second insulating layer 130 disposed in which the wiring portion 140 is disposed, and the metal pad 150 is electrically connected to the wiring portion 140.

The light emitting element 160 is mounted to the metal pad 10 formed described above. In this case, a light emitting diode (LED) may be used as the light emitting element 160.

When the wiring portion 140 connected to the light emitting element 160 is disposed on a rear surface of the light emitting element 160, slimming of a product to which the printed circuit board is applied may be realized by minimizing a space occupied by the light emitting element 160 and the wiring portion 140 at the printed circuit board.

FIG. 6 is a view illustrating a printed circuit board according to another embodiment of the present invention, more particularly, a view illustrating the embodiment of the printed circuit board in which a bent portion 111 is formed.

The embodiment of FIG. 6 is configured such that the bent portion 111 is formed between a first region 210 in which the light emitting element 160 and the wiring portion 140 are disposed and a second region 220 extending from the first region.

In the case of the printed circuit board in which the bent portion is formed as the embodiment of FIG. 6, when the wiring portion 140 is formed on the rear surface of the metal pad 150 and the light emitting element 160, a width of the first region 210 in which the wiring portion 140 is formed may be minimized, thereby enabling slimming of a product to which the printed circuit board is applied.

A method of manufacturing a printed circuit board according to an embodiment of the present invention will be hereinafter described with reference to FIGS. 4 to 6.

First, the first insulating layer 120 is formed on the metal substrate 110 upon manufacturing the printed circuit board according to the embodiment of the present invention.

In such a case, the first insulating layer 120 may adhere to the metal substrate 110 using the bonding sheet 115.

Then, the wiring portion 140 is disposed on the first insulating layer 120, and the second insulating layer 130 is formed on the wiring portion 140 so that the wiring portion 140 is included in the second insulating layer 130.

The metal pad 150, which is electrically connected to the wiring portion 140, is disposed at the upper part of the second insulating layer 130, and the light emitting element 160 is mounted to the metal pad 150.

After the light emitting element 160 has been mounted to the metal pad 150, as illustrated in FIG. 6, the printed circuit board is bent to be divided into the first region 210 in which the wiring portion 140 and the light emitting element 160 are disposed, and the second region 220 extending from the first region 210, so that the bent portion 111 can be formed.

In this case, in some embodiments, the process for forming the bent portion 111 dividing the first region 210 and the second region 220 may be performed before forming the first insulating layer 120, the second insulating layer 130, the wiring portion 140, and the metal pad 150, and the light emitting element 150 on the metal substrate 110.

FIG. 7 is a view illustrating a lighting unit including a printed circuit board according to an embodiment of the present invention.

The printed circuit board of FIG. 7, as described with reference to FIGS. 4 to 6, includes: the first insulating layer 120 on the metal substrate 110; the bonding sheet 115 for bonding the first insulating layer 120 to the metal substrate 110; the second insulating layer 130 laminated on the first insulating layer 120; the wiring portion 140 disposed in the second insulating layer; the metal pad 150 connected to the wiring portion and formed on the second insulating layer 130; and the light emitting element 160 mounted to the metal pad 150.

A light guide plate 300 diffuses light coming from the light emitting element 160, and the diffused light is supplied to a liquid crystal display module 400 disposed at a position corresponding to an upper part of the light guide plate 300.

As such, in a lighting unit according to an embodiment of the present invention, since the wiring portion 140 is disposed on a rear surface of the metal pad 150 and the light emitting element 160, the width T of an area in which the metal pad 150, the light emitting element 160, and the wiring portion 140 are formed can be minimized, thereby enabling slimming of the lighting unit.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A printed circuit board, comprising:
   a metal substrate;
   a first insulating layer disposed on the metal substrate;
   a second insulating layer disposed on the first insulating layer;
   a metal pad disposed on the second insulating layer;
   a light emitting element disposed on the metal pad; and
   a wiring portion disposed in the second insulating layer,
   wherein the wiring portion is spaced from the light emitting element,
   wherein the wiring portion includes a plurality of wires, and each of the wires is covered by the second insulating layer, and
   wherein an entire lower surface of the light emitting element contacts the metal pad.

2. The printed circuit board of claim 1, wherein the first insulating layer is disposed between the metal substrate and the wiring portion.

3. The printed circuit board of claim 2, wherein the second insulating layer is laminated between the first insulating layer and the light emitting element.

4. The printed circuit board of claim 2, further comprising:
   a bonding sheet configured to bond the first insulating layer to the metal substrate; and
   the metal pad formed between the wiring portion and the light emitting element and configured to electrically connect the wiring portion and the light emitting element.

5. The printed circuit board of claim 2, wherein the first insulating layer is formed in a film or tape form.

6. The printed circuit board of claim 2, wherein the first insulating layer contains at least one of a polyimide resin, a polyester resin, an epoxy resin, or a phenol resin.

7. The printed circuit board of claim 1, wherein the printed circuit board comprises:
   a first region in which the wiring portion and the light emitting element are disposed; and
   a second region extending from the first region.

8. The printed circuit board of claim 7, further comprising a bent portion formed between the first region and the second region.

9. The printed circuit board of claim 1, wherein the metal substrate is made of a material containing at least one of aluminum (Al), gold (Au), silver (Ag), chromium (Cr), and the wiring portion contains copper (Cu).

10. The printed circuit board of claim 1, wherein the light emitting element is a light emitting diode (LED).

11. A lighting unit, comprising
    a printed circuit board including a metal substrate, a first insulating layer disposed on the metal substrate, a second insulating layer disposed on the first insulating layer, a metal pad disposed on the second insulating layer, a light emitting element disposed on the metal pad, and a wiring portion disposed in the second insulating layer; and
    a light guide plate configured to diffuse light from the light emitting element wherein the wiring portion is spaced from the light emitting element,
    wherein the wiring portion comprising a plurality of wires, and each of wires is covered by the second insulating layer, and
    wherein an entire lower surface of the light emitting element contacts the metal pad.

12. The lighting unit of claim 11, wherein the first insulating layer disposed between the metal substrate and the wiring portion.

13. The lighting unit of claim 12, wherein the second insulating layer laminated between the first insulating layer and the light emitting element.

14. The lighting unit of claim 12, further comprising: a bonding sheet configured to adhere the first insulating layer to the metal substrate; and the metal pad formed between the wiring portion and the light emitting element and configured to electrically connect the wiring portion and the light emitting element.

15. The lighting unit of claim 12, wherein the first insulating layer is formed in a film or tape form and contains at least one of a polyimide resin, a polyester resin, an epoxy resin, and a phenol resin.

16. The lighting unit of claim 11, wherein the printed circuit board comprises a first region in which the wiring portion and the light emitting element are disposed; and a second region extending from the firs region.

17. The lighting unit of claim 16, further comprising a bent portion formed between the first region and the second region.

18. The printed circuit board of claim 11, wherein the metal substrate is made of a material containing at least one of aluminum (Al), gold (Au), silver (Ag), or chromium (Cr), and the wiring portion contains copper (Cu).

19. The printed circuit board of claim 11, wherein the light emitting element is a light emitting diode (LED).

* * * * *